US009030839B2

(12) United States Patent
Leggett et al.

(10) Patent No.: US 9,030,839 B2
(45) Date of Patent: May 12, 2015

(54) TRACK PAD ACOUSTIC FEATURES RELATED TO A PORTABLE COMPUTER

(71) Applicant: Apple Inc., Cupertino, CA (US)

(72) Inventors: William F. Leggett, San Francisco, CA (US); David M. Rockford, Los Alamitos, CA (US); Gavin J. Reid, Campbell, CA (US); Matthew P. Casebolt, Fremont, CA (US); Changsoo Jang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 28 days.

(21) Appl. No.: 13/855,688

(22) Filed: Apr. 2, 2013

(65) Prior Publication Data

US 2014/0111914 A1    Apr. 24, 2014

Related U.S. Application Data

(60) Provisional application No. 61/715,810, filed on Oct. 18, 2012, provisional application No. 60/715,820, filed on Oct. 18, 2012.

(51) Int. Cl.
| | |
|---|---|
| *H05K 7/00* | (2006.01) |
| *G06F 1/16* | (2006.01) |
| *H01H 11/00* | (2006.01) |
| *H01H 9/02* | (2006.01) |
| *H05K 3/32* | (2006.01) |
| *G06F 1/18* | (2006.01) |
| *G06F 3/0354* | (2013.01) |

(52) U.S. Cl.
CPC ............... *G06F 1/169* (2013.01); *H01H 11/00* (2013.01); *H01H 9/02* (2013.01); *H05K 3/32* (2013.01); *G06F 1/182* (2013.01); *G06F 3/03547* (2013.01)

(58) Field of Classification Search
CPC ............................ G06F 1/169; G06F 3/03547
USPC ............ 361/679.1, 679.18, 679.55, 748, 749, 361/752, 760, 761, 781; 345/173
See application file for complete search history.

(56) References Cited

U.S. PATENT DOCUMENTS

| | | | | |
|---|---|---|---|---|
| 5,977,867 | A * | 11/1999 | Blouin | ........................ 340/407.2 |
| 6,239,726 | B1 * | 5/2001 | Saida | ............................ 340/999 |
| 7,948,741 | B2 * | 5/2011 | Fan | ............................ 361/679.1 |
| 8,139,347 | B2 * | 3/2012 | Chiang et al. | ............ 361/679.18 |
| 8,149,221 | B2 | 4/2012 | Newton | |
| 8,319,752 | B2 | 11/2012 | Hardie-Bick | |
| 2002/0089819 | A1 | 7/2002 | Misawa et al. | |

(Continued)

FOREIGN PATENT DOCUMENTS

| | | |
|---|---|---|
| WO | WO2010039383 | 4/2010 |
| WO | 2011119368 A1 | 9/2011 |

OTHER PUBLICATIONS

PCT Application No. PCT/US2013/065113—International Search Report & Written Opinion dated Jan. 28, 2014.

*Primary Examiner* — Adrian S Wilson
(74) *Attorney, Agent, or Firm* — Downey Brand LLP

(57) ABSTRACT

The present application describes various embodiments of systems and methods for providing internal and external components for portable computing devices having a thin profile. More particularly, the present application describes internal components configured to fit within a relatively thin outer enclosure, wherein the internal components comprise at least one external interface, such as, for example, a track pad interface.

29 Claims, 16 Drawing Sheets

(56) References Cited

U.S. PATENT DOCUMENTS

| | | |
|---|---|---|
| 2007/0052691 A1 | 3/2007 | Zadesky et al. |
| 2007/0085838 A1* | 4/2007 | Ricks et al. .................... 345/173 |
| 2007/0205919 A1* | 9/2007 | Wu ................................. 341/22 |
| 2007/0289858 A1* | 12/2007 | Choi ............................. 200/5 A |
| 2008/0202824 A1* | 8/2008 | Philipp et al. .............. 178/18.01 |
| 2008/0246741 A1* | 10/2008 | Hinata .......................... 345/173 |
| 2008/0252601 A1 | 10/2008 | Boys |
| 2009/0122026 A1* | 5/2009 | Oh ................................. 345/174 |
| 2010/0046179 A1* | 2/2010 | Arita ............................ 361/752 |
| 2010/0079404 A1* | 4/2010 | Degner et al. ................ 345/174 |
| 2010/0155990 A1* | 6/2010 | Yang et al. .................... 264/259 |
| 2010/0265184 A1* | 10/2010 | Jung ............................. 345/169 |
| 2011/0037734 A1 | 2/2011 | Pance et al. |
| 2011/0065480 A1* | 3/2011 | Kim et al. ..................... 455/566 |
| 2011/0075336 A1* | 3/2011 | Chiang et al. ............ 361/679.02 |
| 2011/0080354 A1* | 4/2011 | Chiang et al. ................ 345/173 |
| 2011/0141052 A1 | 6/2011 | Bernstein et al. |
| 2011/0199328 A1 | 8/2011 | Long |
| 2012/0069585 A1* | 3/2012 | Hirota .......................... 362/382 |
| 2012/0080301 A1* | 4/2012 | Alvarez et al. ................ 200/513 |
| 2012/0134089 A1* | 5/2012 | Wu et al. .................... 361/679.4 |
| 2013/0265800 A1* | 10/2013 | Hong et al. ................... 362/602 |
| 2014/0111953 A1* | 4/2014 | McClure et al. ............. 361/749 |

* cited by examiner

TRACK PAD ACOUSTIC FEATURES RELATED TO A PORTABLE COMPUTER

CROSS REFERENCE TO RELATED APPLICATIONS

This U.S. Patent Application claims priority under 35 USC 119(e) to U.S. Provisional Patent Application No. 61/715,810 filed Oct. 18, 2012 entitled "Trackpad Features of a Portable Computer" by Jang et al. and to U.S. Provisional Patent Application No. 61/715,820 filed Oct. 18, 2012 entitled "Manufacturing Features Related to an Internal Components of a Portable Computer" by Espiritu et al both of which are incorporated by reference in its entirety for all purposes.

TECHNICAL FIELD

The embodiments described herein relate generally to portable computing devices. More particularly, the present embodiments relate to internal components that may be included in portable computing devices which include at least one external interface, for example, a track pad interface.

BACKGROUND

The outward appearance of a portable computing device, including its design and its heft, is important to a user of the portable computing device, as the outward appearance contributes to the overall impression that the user has of the portable computing device. Dimensions of the portable computing device may be particularly important to a user.

One design challenge associated with the manufacture of portable computing devices is the design of internal components as they relate to an enclosure of the portable computing device. When the design of the enclosure is selected to be relatively compact, the internal components within the enclosure must be designed and configured to fit within the compact space of the enclosure. Internal component functionality should not be compromised to because of a lack of implementation space.

Therefore, it is desirable for internal components of a portable computing device to have good functionality and to have a compact configuration to allow integration into relatively compact volumes.

SUMMARY

Embodiments of improved internal components for a portable computing device are provided. In one embodiment a track pad includes a cover, a touch sensor, and a printed circuit board. The printed circuit board may be connected to the touch sensor and coupled to the cover at an end thereof that is free to pivot. Thereby, the printed circuit board may stiffen the end of the cover. This may facilitate use of a dome switch coupled to the printed circuit board and configured to operate upon pivoting the cover without use of a separate stiffener for the cover.

According to another embodiment, a portable computing device includes a base portion including a top case, the top case including a set screw, bottom case and a track pad coupled to the top case. The track pad comprises a cover extending from a first end to a second end, the first end of the cover pivotally coupled to the top case with the second end decoupled from the top case, a touch sensor, a printed circuit board in communication with the touch sensor and coupled to the second end of the cover, and a switch coupled to the touch sensor and configured to actuate upon pivoting the cover about the first end and contacting the set screw.

According to another embodiment, a fixture is provided to calibrate a set screw position used in a track pad assembly. The fixture can include a switch coupled to a touch sensor, a support member including a threaded hole positioned over the switch, a gauge fixture configured to fit within the threaded hole and a set screw disposed on the gauge fixture.

In another embodiment, a method is provided for attaching ground tabs coupled to a touch pad to a printed circuit board can include the steps of receiving the touch pad and ground tab, where a first end of the ground tab is coupled to the touch pad, bending a second end of the ground tab to form an acute angle between the second end of the ground tab and the touch pad, arranging the printed circuit board to contact the ground tab in a contact region, heating the contact region bonding the printed circuit board to the ground tab and folding the ground tabs to configure printed circuit board to contact the touch pad.

Embodiments of acoustic components related to a track pad for a portable computing device are provided. In one embodiment, a track pad can include a cover extending from a first end to a second end where the first end of the cover can be configured to pivotally couple to a case of the portable computing device with the second end decoupled from the case. The track pad can also include a touch sensor and a printed circuit board in communication with the touch sensor and coupled to the second end of the cover where the printed circuit board is configured to support the second end of the cover. The track pad can include a dome switch coupled to the touch sensor and configured to actuate upon pivoting the cover about the first and at least one acoustic transmission member configured to guide acoustic energy within the track pad.

In another embodiment, a portable computing device can include a lid portion configured to include a display, a base portion including a top case and a bottom case pivotally coupled to the lid portion where the top case can include a palm rest zone, a keyboard zone and a track pad zone, configured to support a track pad, the track pad including a cover with a first end and a second end, the first end pivotally coupled to the top case and the second end decoupled from the top case, a touch sensor, a printed circuit board in communication with the touch sensor and coupled to the second end of the cover where the printed circuit board is configured to support the second end of the cover and at least one acoustic transmission member configured to guide acoustic energy within the track pad.

In yet another embodiment, a portable computing device can include a base portion including a top and a bottom case and a track pad, the track pad including a cover extending from a first end to a second end, the first end of the cover pivotally coupled to the top case with the second end decoupled from the top case, a touch sensor, a printed circuit board in communication with the touch sensor and coupled to the second end of the cover, the printed circuit configured to support the second end of the cover, a dome switch coupled to the touch sensor and configured to actuate when the cover is pivoted about the first end and at least one acoustic transmission member configured to guide acoustic energy within the track pad.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed apparatuses, assemblies, methods, and systems. These drawings in no way limit any changes in form and detail that may be made to the disclosure by one skilled in the art without departing from the spirit and scope of the disclosure.

DETAILED DESCRIPTION

Figure 1:
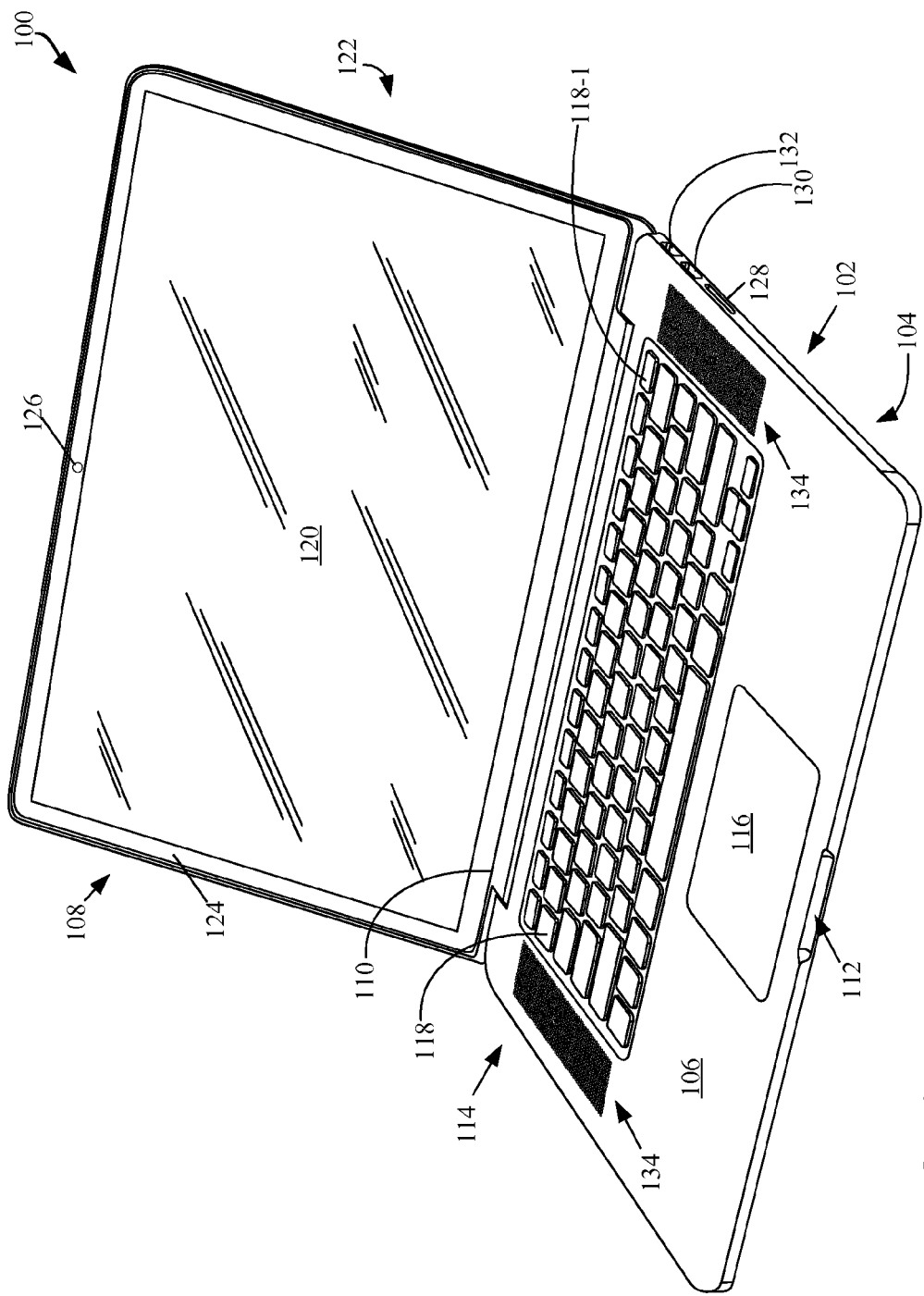
FIG. 1 shows a front facing perspective view of an embodiment of the portable computing device in the form of portable computing device in an open (lid) state according to an example embodiment of the present disclosure.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

The following relates to a portable computing device such as a laptop computer, net book computer, tablet computer, etc. The portable computing device can include a multi-part housing having a top case and a bottom case joining at a reveal to form a base portion. The portable computing device can have an upper portion (or lid) that can house a display screen and other related components whereas the base portion can house various processors, drives, ports, battery, keyboard, track pad and the like. The top case and the bottom case can each be joined in a particular manner at an interface region such that the gap and offset between top and bottom cases are not only reduced, but are also more consistent from device to device during the mass production of devices. These general subjects are set forth in greater detail below.

In a particular embodiment, the lid and base portion can be pivotally connected with each other by way of what can be referred to as a clutch assembly. The clutch assembly can be arranged to pivotally couple the base portion to the lid. The clutch assembly can include at least a cylindrical portion that in turn includes an annular outer region, and a central bore region surrounded by the annular outer region, the central bore suitably arranged to provide support for electrical conductors between the base portion and electrical components in the lid. The clutch assembly can also include a plurality of fastening regions that couple the clutch to the base portion and the lid of the portable computing device with at least one of the fastening regions being integrally formed with the cylindrical portion such that space, size and part count are minimized.

The multipart housing can be formed of a strong and durable yet lightweight material. Such materials can include composite materials and or metals such as aluminum. Aluminum has a number of characteristics that make it a good choice for the multipart housing. For example, aluminum is a good electrical conductor that can provide good electrical ground; it can be easily machined and has well known metallurgical characteristics. The superior conductivity of aluminum provides a good chassis ground for internal electrical components arranged to fit and operate within the housing. The aluminum housing also provides a good electromagnetic interference (EMI) shield protecting sensitive electronic components from external electromagnetic radiation as well as reducing electromagnetic radiation emanating from the portable computing device.

The top case can include a cavity, or lumen, into which a plurality of operational components can be inserted during an assembly operation. In the described embodiment, the operational components can be inserted into the lumen and attached to the top case in a "top-bottom" assembly operation in which top-most components are inserted first, followed by components in a top-down arrangement. For example, the top case can be provided and shaped to accommodate a keyboard module. The keyboard module can include a keyboard assembly formed of a plurality of keycap assemblies and associated circuitry, such as a flexible membrane on which can be incorporated a switching matrix and protective feature plate. Therefore, following the top-bottom assembly approach, the keyboard assembly is first inserted into the top case followed by the flexible membrane and then the feature plate that is attached to the top case. Other internal components can then be inserted in a top to bottom (when viewed from the perspective of the finished product) manner.

In addition to the keyboard, the portable computing device can include a touch sensitive device along the lines of a track pad, touch screen, etc. In those embodiments where the portable computing device includes a track pad the track pad can be formed from a glass material. The glass material provides a cosmetic surface and is the primary source of structural rigidity for the track pad. The use of the glass material in this way significantly reduces the overall thickness of the track pad compared to previous designs. The track pad can include circuitry for processing signals from a sensor associated with the track pad. In one embodiment, the circuitry can be embodied as a printed circuit board (PCB). The PCB can be formed of material and placed in such a way that provides structural support for the track pad as well as increased rigidity. Thus, a separate track pad support is eliminated.

Due at least to the strong and resilient nature of the material used to form the multipart housing; the multipart housing can include a number of openings having wide spans that do not require additional support structures. Such openings can take the form of ports that can be used to provide access to internal circuits. The ports can include, for example, data ports suitable for accommodating data cables configured for connecting external circuits. The openings can also provide access to an audio circuit, video display circuit, power input, etc.

In one embodiment, the top case can be formed from a single billet of aluminum that is machined into a desired shape and size. The top case can include an integrated support system that adds to the structural integrity of the top case. The integrated support system can be continuous in nature in that there are no gaps or breaks. The integrated support system can be used to provide support for individual components (such as a keyboard). For example, the integrated support system can take the form of ribs that can be used as a reference datum for a keyboard. The ribs can also provide additional structural support due to the added thickness of the ribs. The ribs can also be used as part of a shield that help to prevent light leaking from the keyboard as well as act as a Faraday cage that prevents leakage of extraneous electromagnetic radiation.

The continuous nature of the integrated support system can result in a more even distribution of an external load applied to the multi-part housing resulting in a reduced likelihood of warping, or bowing that reduces risk to internal components. The integrated support system can also provide mounting structures for those internal components mounted to the multi-part housing. Such internal components include a mass storage device (that can take the form of a hard disk drive, HDD, or solid state drive, SSD), audio components (audio jack, microphone, speakers, etc.) as well as input/output devices such as a keyboard and track pad.

These and other embodiments are discussed below with reference to FIGS. 1-12. However, those skilled in the art will readily appreciate that the detailed description given herein with respect to these figures is for explanatory purposes as the invention extends beyond these limited embodiments.

FIGS. 1-6 show various views of the portable computing device in accordance with various embodiments. FIG. 1 shows a front facing perspective view of an embodiment of the portable computing device in the form of portable computing device 100 in an open (lid) state. Portable computing device 100 can include base portion 102 formed of bottom case 104 fastened to top case 106. Base portion 102 can be pivotably connected to lid portion 108 by way of clutch assembly 110 hidden from view by a cosmetic wall. Base portion 102 can have an overall uniform shape sized to accommodate clutch assembly 110 and inset portion 112 suitable for assisting a user in lifting lid portion 108 by, for example, a finger. Top case 106 can be configured to accommodate various user input devices such as keyboard 114 and track pad 116. Keyboard 114 can include a plurality of low profile keycap assemblies each having an associated key pad 118. In one embodiment, an audio transducer (not shown) can use selected portions of keyboard 114 to output audio signals such as music. In the described embodiment, a microphone can be located at a side portion of top case 106 that can be spaced apart to improve frequency response of an associated audio circuit.

Each of the plurality of key pads 118 can have a symbol imprinted thereon for identifying the key input associated with the particular key pad. Keyboard 114 can be arranged to receive a discrete input at each keypad using a finger motion referred to as a keystroke. In the described embodiment, the symbols on each key pad can be laser etched thereby creating an extremely clean and durable imprint that will not fade under the constant application of keystrokes over the life of portable computing device 100. In order to reduce component count, a keycap assembly can be re-provisioned as a power button. For example, key pad 118-1 can be used as power button 118-1. In this way, the overall number of components in portable computing device 100 can be commensurably reduced.

Track pad 116 can be configured to receive finger gesturing. A finger gesture can include touch events from more than one finger applied in unison. The gesture can also include a single finger touch event such as a swipe or a tap. The gesture can be sensed by a sensing circuit in track pad 116 and converted to electrical signals that are passed to a processing unit for evaluation. In this way, portable computing device 100 can be at least partially controlled by touch.

Lid portion 108 can be moved with the aid of clutch assembly 110 from the closed position to remain in the open position and back again. Lid portion 108 can include display 120 and rear cover 122 (shown more clearly in FIG. 2) that can add a cosmetic finish to lid portion 108 and also provide structural support to at least display 120. In the described embodiment, lid portion 108 can include mask (also referred to as display trim) 124 that surrounds display 120. Display trim 124 can be formed of an opaque material such as ink deposited on top of or within a protective layer of display 120. Display trim 124 can enhance the overall appearance of display 120 by hiding operational and structural components as well as focusing attention onto the active area of display 120.

Display 120 can display visual content such as a graphical user interface, still images such as photos as well as video media items such as movies. Display 120 can display images using any appropriate technology such as a liquid crystal display (LCD), OLED, etc. Portable computing device 100 can also include image capture device 126 located on a transparent portion of display trim 124. Image capture device 126 can be configured to capture both still and video images. Lid portion 108 can be formed to have uni-body construction that can provide additional strength and resiliency to lid portion 108 which is particularly important due to the stresses caused by repeated opening and closing. In addition to the increase in strength and resiliency, the uni-body construction of lid portion 108 can reduce overall part count by eliminating separate support features.

Data ports 128-132 can be used to transfer data and/or power between an external circuit(s) and portable computing device 100. Data ports 128-132 can include, for example, input slot 128 that can be used to accept a memory card (such as a FLASH memory card), data ports 130 and 132 can be used to accommodate data connections such as USB, FireWire, Thunderbolt, and so on. In some embodiments, speaker grid 134 can be used to port audio from an associated audio component enclosed within base portion 102.

Figure 2:
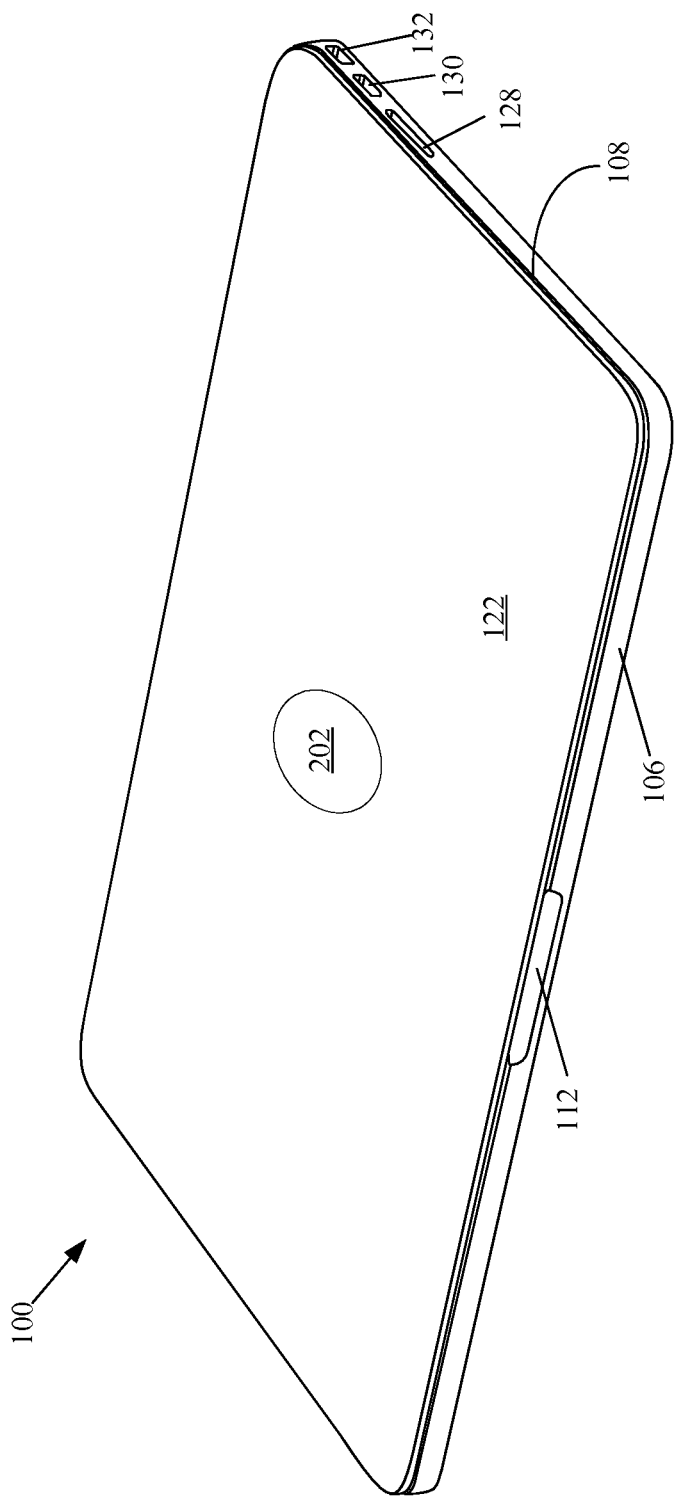
FIG. 2 shows the portable computing device of FIG. 1 in a closed (lid) configuration that shows rear cover and logo according to an example embodiment of the present disclosure.

FIG. 2 shows portable computing device 100 in a closed (lid) configuration that shows rear cover 122 and logo 202. In one embodiment, logo 202 can be illuminated by light from display 120. It should be noted that in the closed configuration, lid portion 108 and base portion 102 form what appears to be a uniform structure having a continuously varying and coherent shape that enhances both the look and feel of portable computing device 100.

Figure 3:
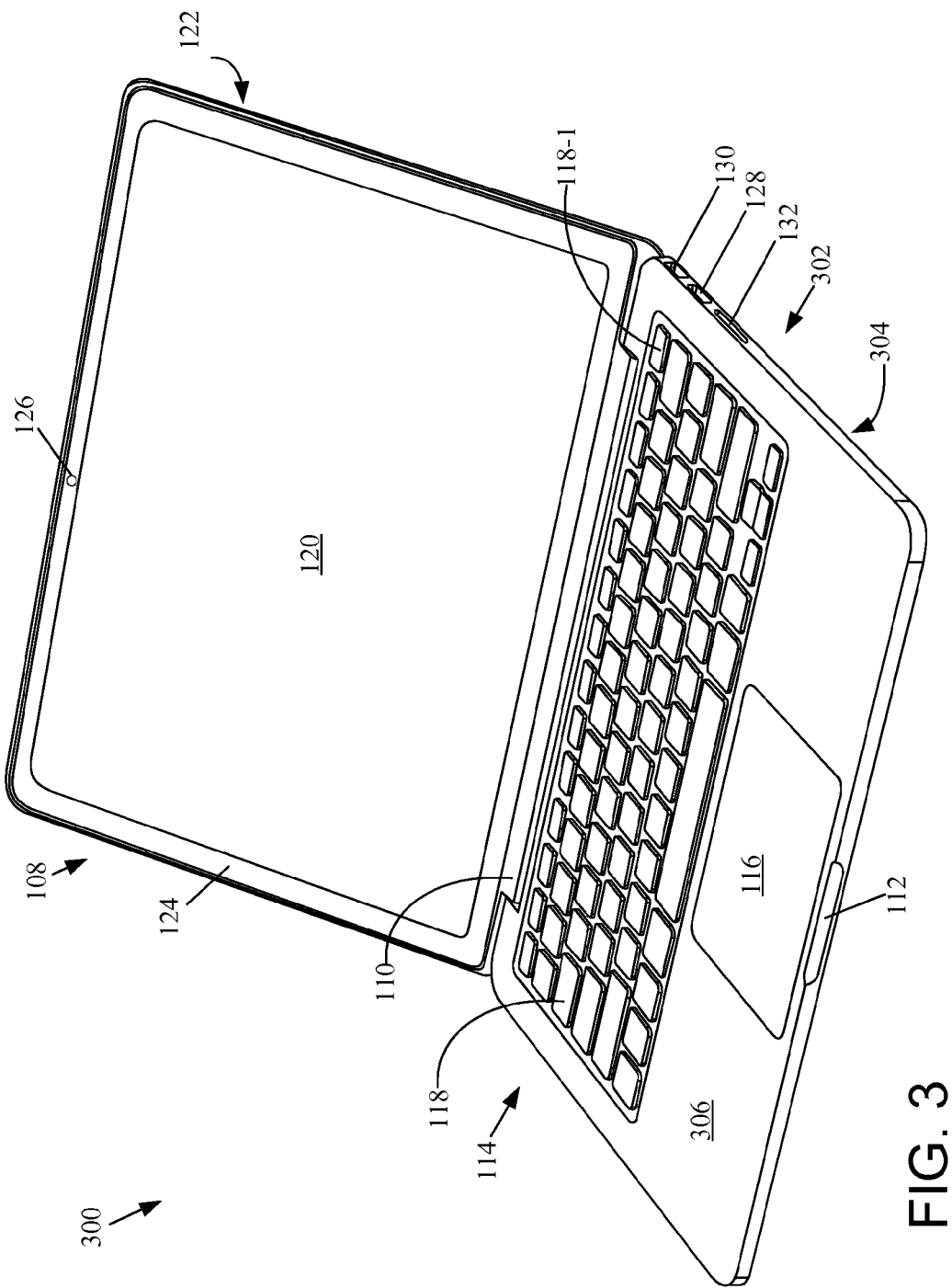
FIG. 3 shows another embodiment of the portable computing device in an open state according to an example embodiment of the present disclosure.

FIG. 3 shows another embodiment in the form of portable computing device 300 that is smaller than portable computing device 100. Since portable computing device 300 is smaller in size than portable computing device 100, certain features shown in FIG. 1 are modified, or in some cases lacking, in portable computing device 300. For example, base portion 302 can be reduced in size such that separate speakers (such as speaker grid 134) are replaced with an audio port embodied as part of keyboard 114. However, bottom case 304 and top case 306 can retain many of the features described with regards to portable computing device 100 (such as display 120 though reduced to an appropriate size).

Figure 4:
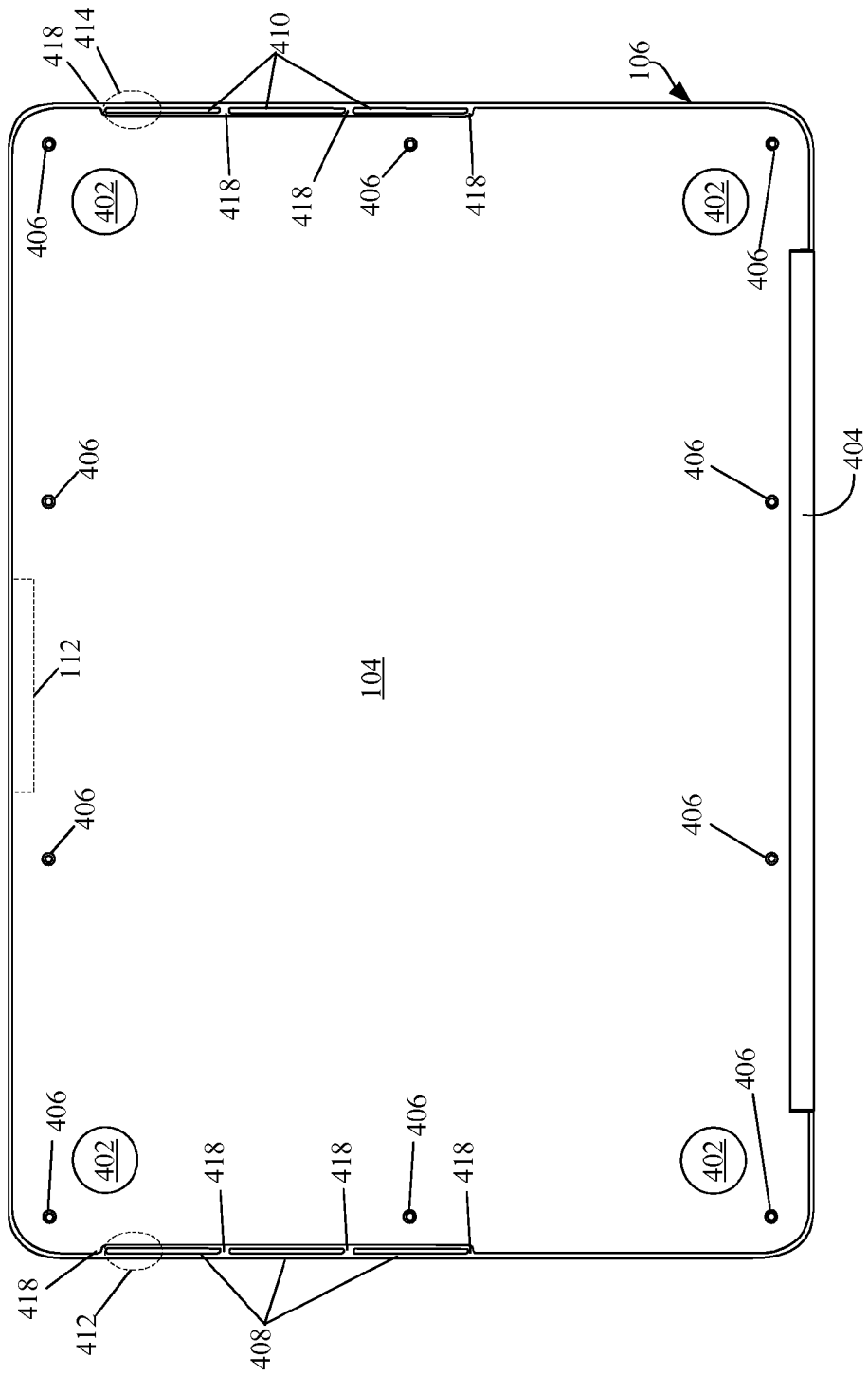
FIG. 4 shows an external view of the bottom case of the portable computing device of FIG. 1 or 3 according to an example embodiment of the present disclosure.

FIG. 4 shows an external view of bottom case 104 showing relative positioning of support feet 402, inset 112, cosmetic wall 404 that can be used to conceal clutch assembly 110 and fasteners 406 used to secure bottom case 104 and top case 106 together. Support feet 402 can be formed of wear resistant and resilient material such as plastic. Also in view are multi-purpose front side sequentially placed vents 408 and 410 that can be used to provide a flow of outside air that can be used to cool internal components. In the described embodiment, vents 408 and 410 can be placed on an underside of top cover 106 in order to hide the vents from view as well as obscure the view of an interior of portable computing device 100 from the outside. Vents 408 and 410 can act as a secondary air intake subordinate to primary air intake vents located at a rear portion of portable computing device 100 (described below). In this way, vents 408 and 410 can help to maintain an adequate supply of cool air in those situations where portions of the rear vents are blocked or otherwise have their air intake restricted.

Vents 408 and 410 can also be used to output audio signals in the form of sound generated by an audio module (not shown). In one embodiment, a selected portion (such as portions 412 and 414) can be used to output sound at a selected frequency range in order to improve quality of an audio presentation by portable computing device 100. Vents 408 and 410 can be part of an integrated support system in that vents 408 and 410 can be machined from the outside and cut from the inside during fabrication of top case 106. As part of the machining of vents 408 and 410, stiffener ribs can be placed within vent openings 408 and 410 to provide additional structural support for portable computing device 100.

Moreover, trusses 418 can be formed between vents 408 and 410 in combination with stiffener ribs to add both structural support as well as assist in defining both the cadence and size of vents 408 and 410. The cadence and size of vents 408 and 410 can be used to control air flow into portable computing device 100 as well as emission of RF energy in the form of EMI from portable computing device 100. Accordingly, stiffener ribs can separate an area within vents 408 and 410 to produce an aperture sized to prevent passage of RF energy. The size of an aperture can restrict the emission of RF energy having a wavelength that can be "trapped" by the aperture. In this case, the size of vents 408 and 410 is such that a substantial portion of RF energy emitted by internal components can be trapped within portable computing device 100. Furthermore, by placing vents 408 and 410 at a downward facing surface of top case 106, the aesthetics of portable computing device 100 can be enhanced since views of internal components from an external observer are suppressed.

Figure 5:
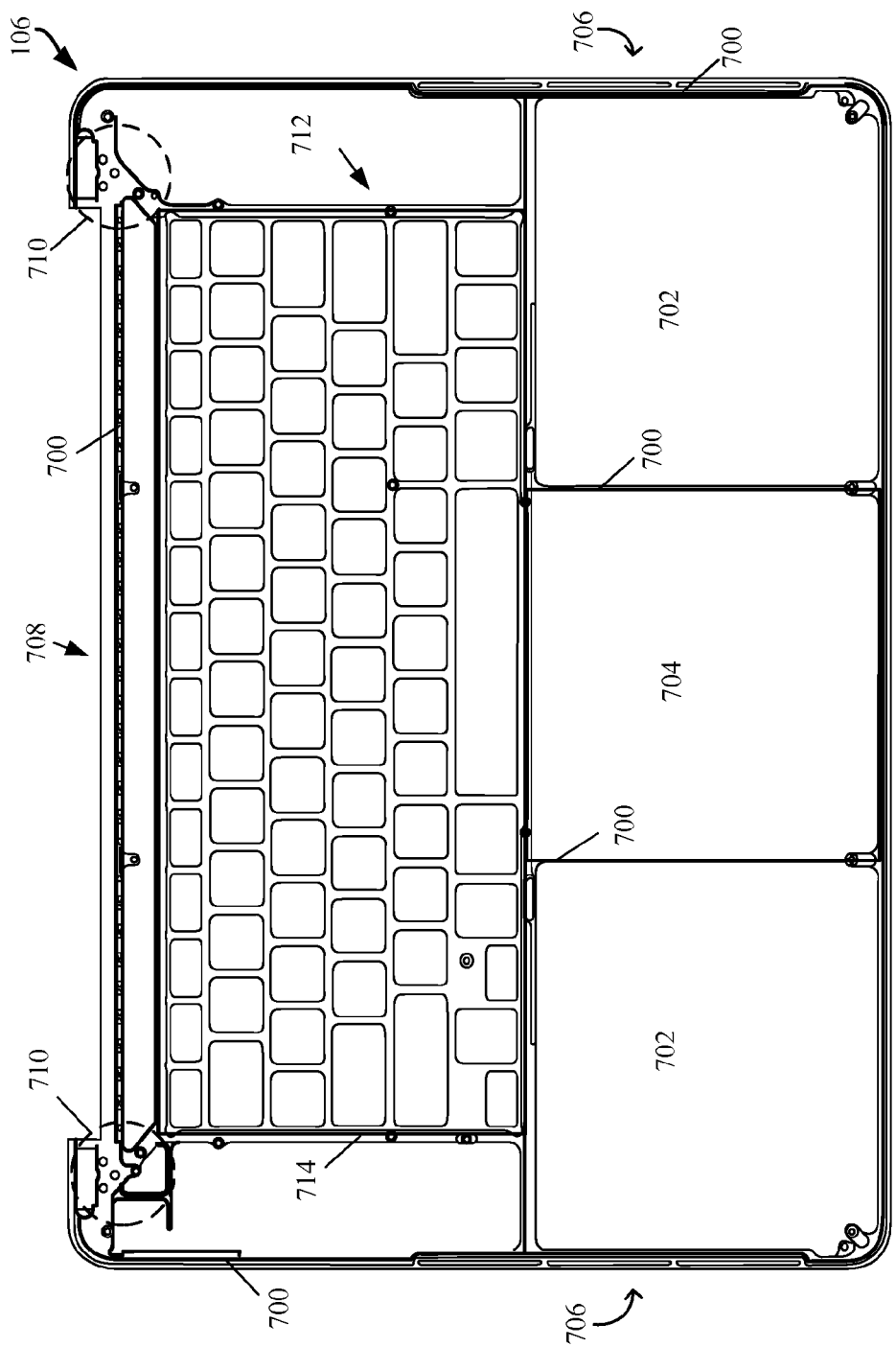
FIG. 5 illustrates a top case with an integrated support system according to an example embodiment of the present disclosure.

FIG. 5 shows integrated support system in accordance with the described embodiments. In order to enhance the structural integrity, reduce bowing, and improve resistance to infrequent but potentially damaging events such as being dropped, top case 106 can be fabricated to include integrated support system 700. Generally speaking, top case 106 can be divided into various structural zones each of which can be expected to be exposed to various amounts and types of stress. For example, top case 106 can divided into palm rest zone 702, track pad zone 704, side vents zone 706, rear vent zone 708, clutch bolt zone 710, and keyboard zone 712 that can each have individual structures that tie in together in a floor-to-ceiling arrangement to form integrated support system 700. (It should be noted that by integrated it is meant that there are substantially no breaks or gaps in the structural elements that form integrated support system 700.) For example, keyboard zone 712 can include keyboard support rib 714 that racetracks about keyboard zone 712. Keyboard support rib 714 can have an enhanced thickness "t" in order to provide a substantially increased resistance to flexing or bending (that is proportional to $t^3$). By interconnecting the various structural elements of integrated support system 700, any stress or other load applied at a particular point in a specific zone can be more evenly distributed within top case 106 thereby reducing the likelihood of bowing or warping top case 106.

Figure 6:
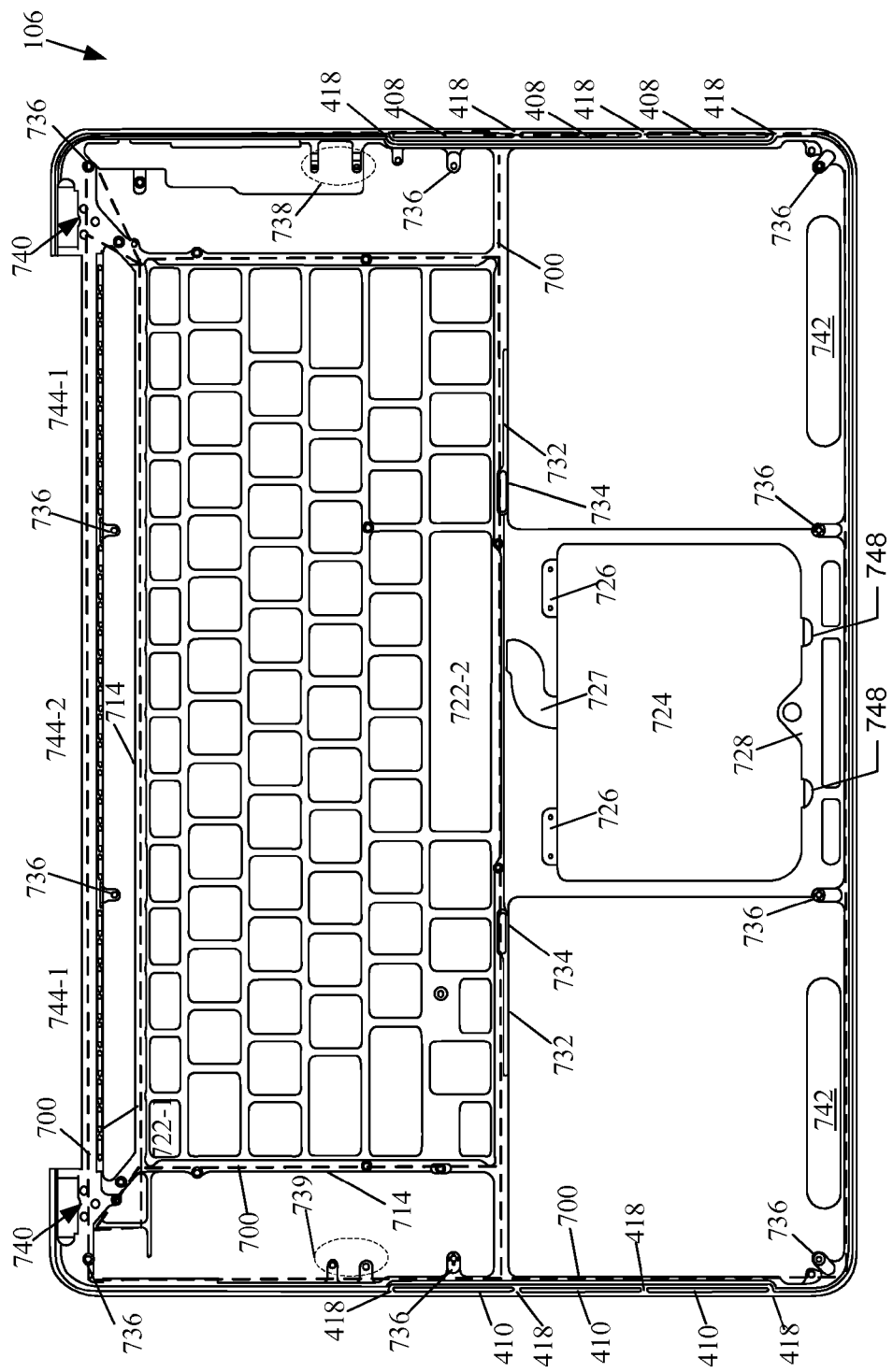
FIG. 6 illustrates a view of the top case of FIG. 5 highlighting the relationship between integrated support system and various structural components according to an example embodiment of the present disclosure.

In addition to providing stress distribution about the perimeter of top case 106, structural elements of integrated support system 700 can span top case 106 in a "crisscross" pattern obviating the problems of flexing due to what can be referred to as a "trampoline" effect, in which a central portion of top case 106 flexes more than does the edge regions (along the lines of a trampoline). In this way, portable computing device 100 can respond to physical impacts and externally applied stress as an integrated whole in contrast to conventionally configured portable computing devices where internal components are discretely attached to a housing with little or no cross support. In this way, the framing of top case 106 in the form of integrated support system 700 can flow from wall to wall and edge to edge and structural member to structural member FIG. 6 shows a view of top case 106 highlighting the relationship between integrated support system 700 and various structural components in accordance with the described embodiment. More particularly, FIG. 6 shows an interior view of top case 106 illustrating various openings used to accommodate keyboard 114 and track pad 116. More specifically, keyboard openings 722 can each have a size and shape in accordance with an associated key cap assembly. For example, opening 722-1 can be sized to accommodate power button 118-1 whereas opening 722-2 can be sized to accommodate a space bar. In addition to keyboard openings 722, opening 724 can accommodate track pad 116. For example, track pad 116 can be attached directly to top case 106 at shoulders 726 and flex support 727 can be used to provide support for a flex connector. Furthermore, a dome switch associated with track pad 116 can be supported at support plate 728.

Top case 106 can be fabricated in such a way that integrated support system 700 (as shown by the broken line) can be used to provide support for internal components as well as a mechanism for distributing loads more evenly about top case 106 thereby avoiding localized stress points. In this way, the likelihood of warping or bowing of top case 106 can be substantially reduced. In addition to providing for load distribution, integrated support system 700 can provide support points and structures for various internal components. For example, as described above, stiffener ribs can be integrally formed with integrated support system 700 in such a way that an external load applied to portable computing device 100 in the vicinity of vents 410 (or 408) can be passed by way of stiffener ribs to integrated support system 700. In this way, the load can be transferred away from the point where the load is applied and distributed more evenly about top case 106 and bottom case 104 thereby reducing the possibility of warping or bowing.

As part of integrated support system 700, magnetic clamp supports 732 can provide a support structure for magnet pad 734 used to support magnets that magnetically attach top case 106 and bottom case 104 together that facilitates the insertion of and securing of fasteners 406 into bosses 736. For example, during an assembly operation, top case 106 and bottom case 104 are first magnetically attached to each other using magnets secured to magnet pad 734. The magnetic attraction is such that sufficient "play" in (x,y) is available for securing fasteners 406 into bosses 736 affording an easier and more timely assembly operation. Moreover, by securing top case 106 and bottom case 104 in a central region, an amount of flexion of bottom case 104 is substantially reduced thereby preventing "belly rub" where an exterior surface of bottom case 104 flexes to the point where it comes in contact with a surface upon which it rests. Other mounting features can include audio jack mounts 738, microphone mounts 739, and clutch assembly support plates 740 for securing clutch assembly 110 to top case 106.

Magnetic attachment plates 742 can be used to form a magnetic circuit with magnets disposed within lid portion 108 for securing lid portion 108 to base portion 102 in the closed configuration of portable computing device 100. Rear vent openings 744 can be used to provide air for cooling internal components such as a CPU, GPU and so forth. In one embodiment, left and right vent openings 744-1 can be used to direct exhaust air away from portable computing device 100 whereas central vent openings 744-2 can be used to direct cooler intake air into portable computing device 100. In addition to vent openings 744, vent openings 408 and 410 can be used as a secondary source of cool intake air in situations in which vent openings 744-2 are partially or fully blocked to assure adequate cooling of various internal components. Keyboard support rib 714 can be used to support a keyboard feature plate as well as part of an EMI shield used to block RF energy and a light block used to block extraneous light emanating from a light source used to illuminate key pads 118.

Figure 7:
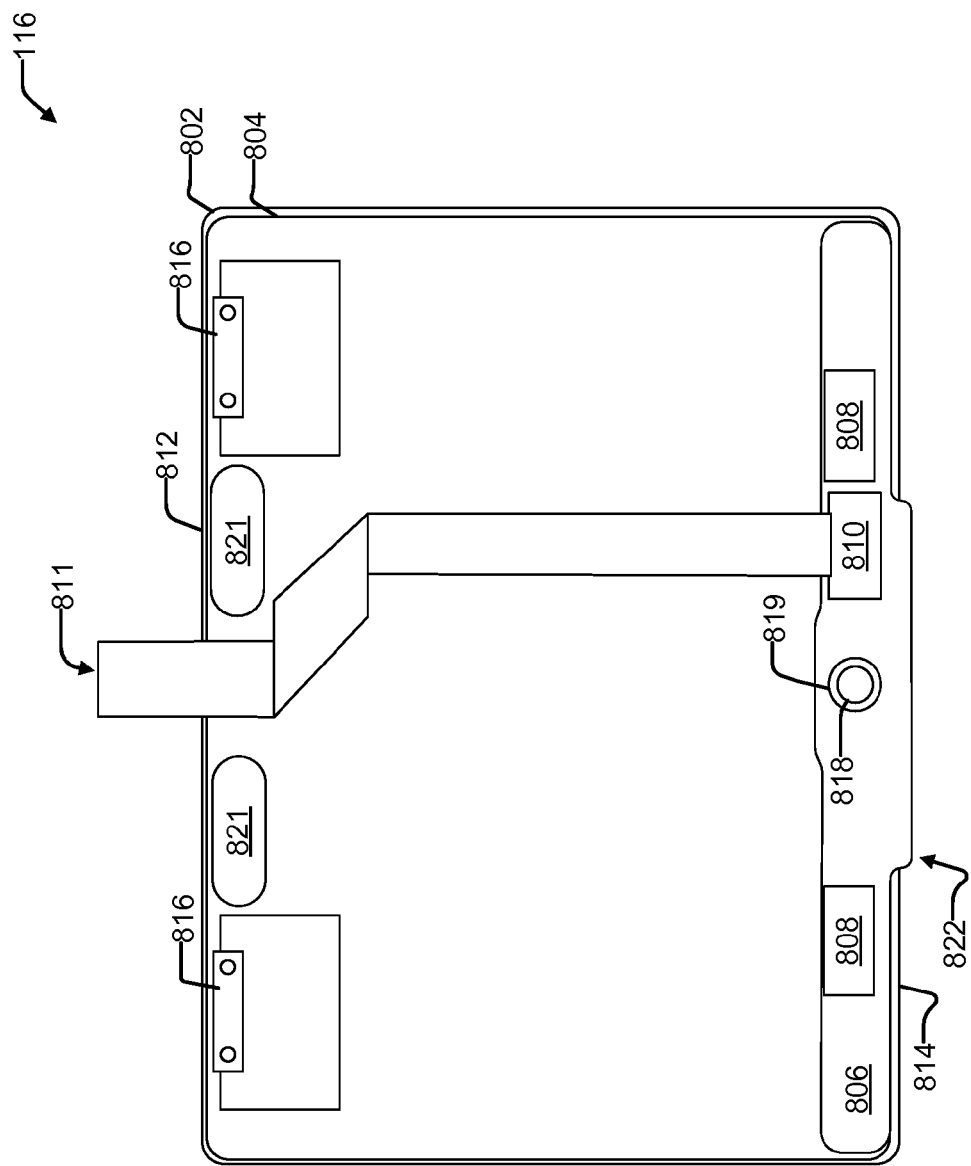
FIG. 7 illustrates a bottom view of a track pad according to an embodiment of the present disclosure.

Returning to the track pad 116, one possible configuration is illustrated in FIG. 7. As illustrated, the track pad 116 may include a cover 802 which may define an outer surface with which a user may interact by inputting gestures thereon. The cover 802 may comprise glass in some embodiments. The gestures may be detected by a touch sensor 804, which may be coupled to the bottom of the cover 802, as illustrated. In some embodiments the touch sensor 804 may comprise a plastic material such polyethylene terephthalate (PET).

The track pad 116 may also include a printed circuit board (PCB) 806 including one or more touch circuits 808 and connectors 810 thereon, and associated communications medium 811 coupled thereto. The touch sensor 804 may be positioned between the printed circuit board 806 and the cover 802. The printed circuit board 806 may be in communication with the touch sensor 804 such that that the printed circuit board 806 receives signals therefrom.

The cover 802 may extend from a first end 812 to a second end 814. The first end 812 of the cover 802 may be pivotally coupled to the top case 106 of the portable computing device 100. In particular, mounting points 816 may be configured to couple to the shoulders 726 of the top case 106 such that the track pad 116 is received in the opening 724 (see, e.g., FIG. 6).

Whereas the first end 812 of the cover 802 may be pivotably coupled to the top case 106, the second end 814 of the cover may be decoupled from the case. Thereby, the second end 814 of the cover 802 may pivot. In this regard, the track pad 116 may further comprise a dome switch 818 (or other embodiment of a switch) positioned proximate the second end 814 of the cover 802. The dome switch 818 may be coupled to the touch sensor 804. Accordingly, as the second end 814 of the cover 802 pivots, the dome switch 818 may be activated. Thus, user inputs may also be inputted through the track pad 116 through pivoting the cover 802 to actuate the dome switch 818.

As further illustrated in FIG. 7, acoustic transmission members 821 are coupled to the track pad 116 near, proximate, and/or adjacent the first end 812. In this manner, when pivoting the assembly as described above, audible sounds produced through the inversion and subsequent reformation of the dome switch 818 may be coupled to an interior of an assembled portable computing device 100/300 through the acoustic transmission members 821. For example, the acoustic transmission members 821 may be formed of semi-closed cell acoustic foam according to some implementations. The acoustic foam may therefore guide acoustic energy therethrough, away from a user of the track pad 116 and towards an interior of the device 100/300 during pivoting (e.g., clicking).

However, due to the second end 814 of the cover 802 being decoupled from the top case 106, it may be desirable to stiffen and support the second end to reduce other undesirable effects besides acoustic dampening. In this regard, the printed circuit board 806 (and additional intervening standoffs 861 illustrated in FIG. 8) may function as a stiffener configured to support the second end 814 of the cover 802. In this regard, the printed circuit board 806 and/or standoffs 861 may also define one or more protrusions 822 that extend past the second end 814 of the cover 802, and which are configured to engage recesses 748 in the top case 106 (cf. FIG. 6). Further, in addition to the touch circuits 808 and connectors 810, the dome switch 818 may be coupled through a hole or recess 819 of the printed circuit board 806.

Coupling of the dome switch 818 through the printed circuit board 806 may offer increased durability as compared to other implementations. For example, as the track pad 116 is pivotally attached to the top case 106, and as the dome switch 818 provides a compliance for activation of the pivoting assembly (e.g., through clicking), coupling through the printed circuit board 806 reduces "swiping" or x-y translation during pivoting due to shorter arc-lengths of pivoting travel, which may increase a useable lifetime of the dome switch 818 and therefore the entire track pad 116. For example, according to experimental results conducted in accordance with this particular implementation, more than about five million click or pivot cycles are possible through coupling of the dome switch through the printed circuit board 806.

Figure 8:
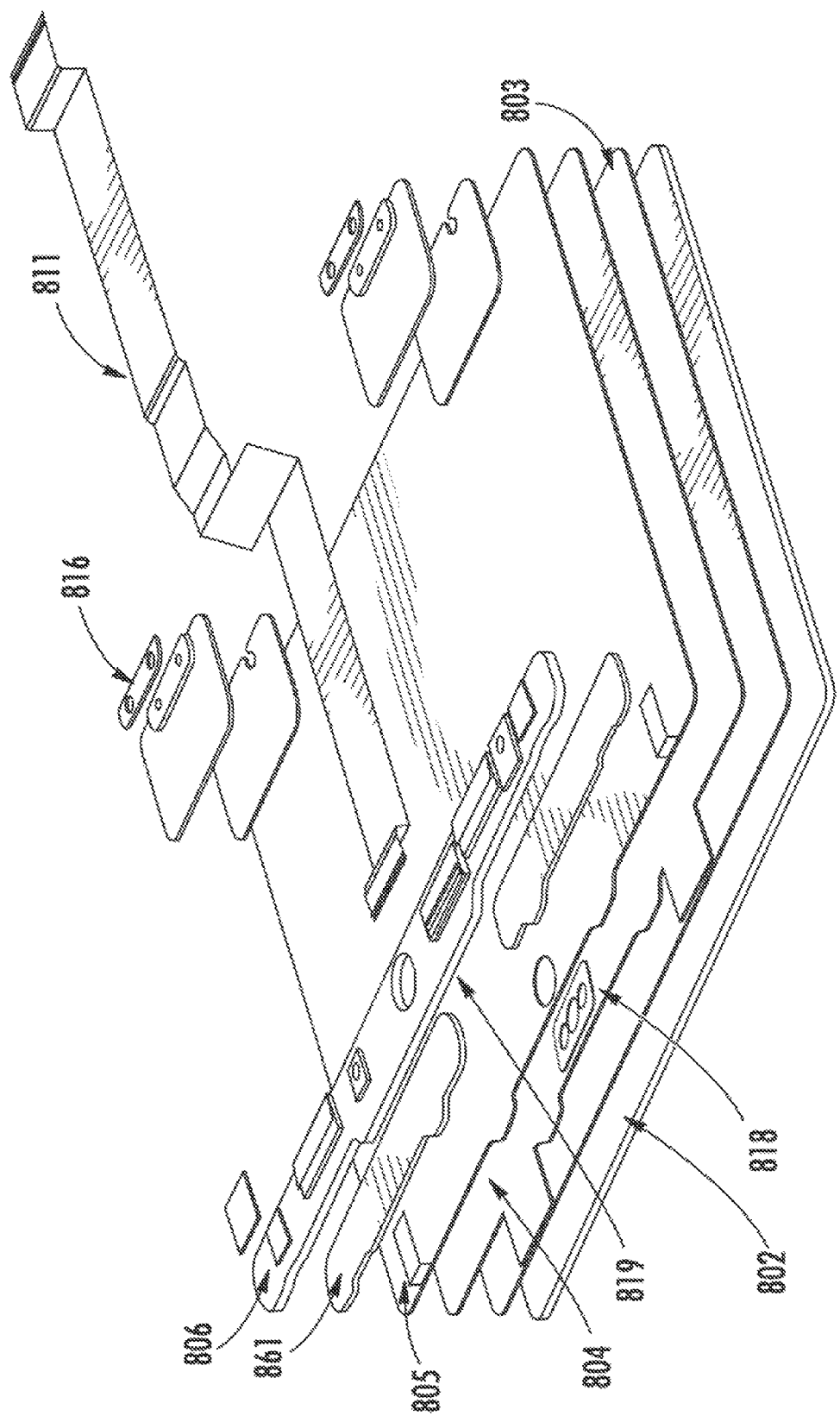
FIG. 8 schematically illustrates an exploded view of the track pad of FIG. 7.

Turning now to FIG. 8, an exploded view of the track pad 116 is presented which further illustrates its benefits.

As shown, the track pad 116 includes the cover or glass 802. The track pad 116 further includes member 803 (optional) arranged between the cover 802 and the touch sensor 804. The member 803 may be a compliance member, adhesive film, polymer film, or any other suitable member. The track pad 116 further includes a grounding film or substantially planar ground potential member 805 arranged on the touch sensor 804. The ground film 805 may provide a reference ground potential for detecting user inputs through the touch sensor 804. In some embodiments, the ground film 805 and touch sensor 804 are integrally arranged as a single unit and may not be illustrated as separate.

Figure 11:
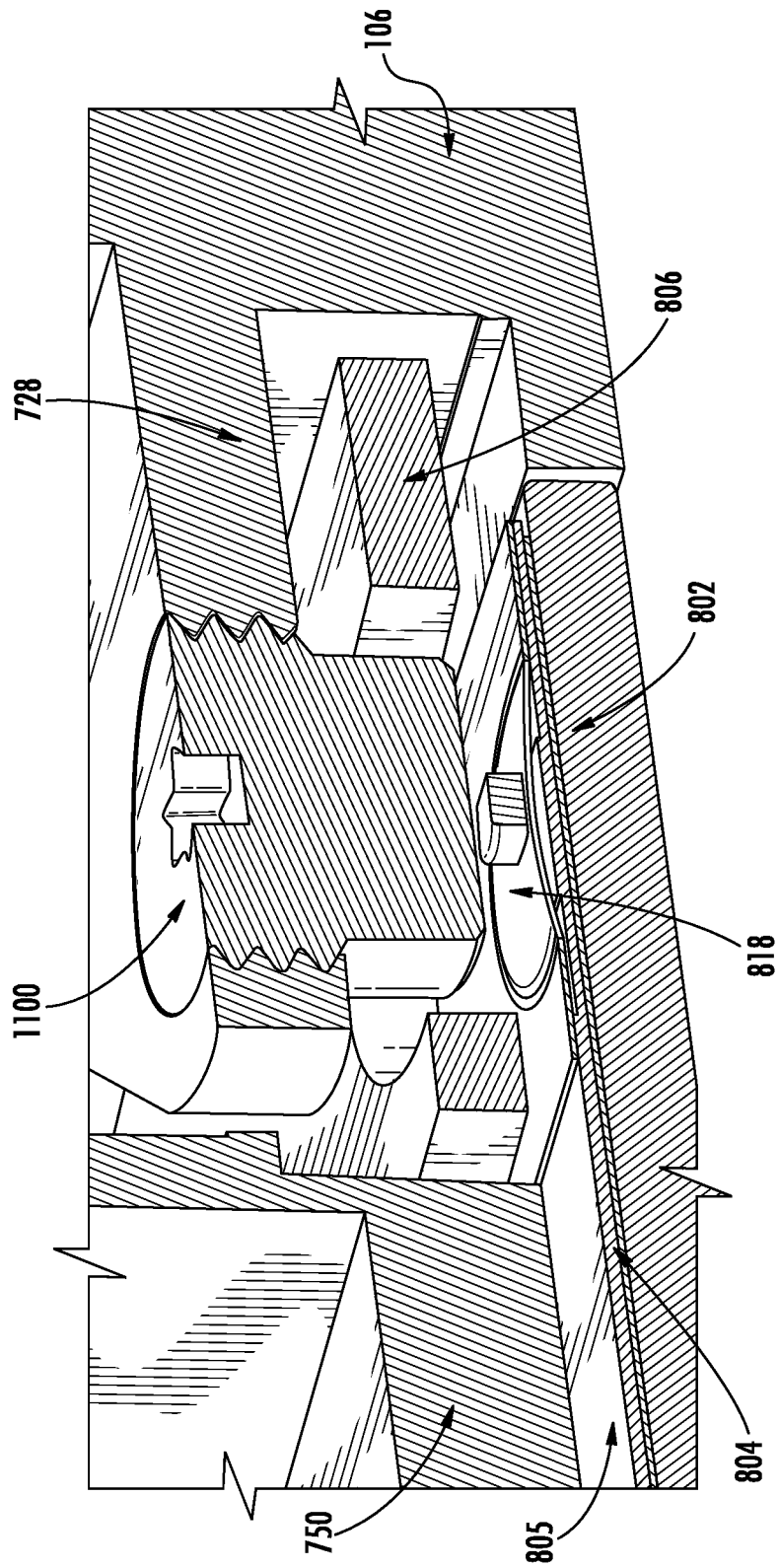
FIG. 11 illustrates an expanded view of a support system of a portion of the track pad of FIG. 7.

The track pad 116 further includes dome switch 818 arranged within hole 819 of the printed circuit board 806 and the ground film 805, and coupled to the touch sensor 804. In this regard, a dome or flexible portion of the dome switch 816 may be arranged to be activated through the hole 819, while being directly coupled to the touch sensor 804. Thus, an additional member 1100 (e.g., set screw or screw-like support member) illustrated in FIG. 11 is provided to allow engagement of the dome switch 818 through the hole 819.

The track pad 116 in FIG. 8 further includes standoff members 861 arranged on the ground film 805. The standoff members 861 may be members configured to add a vertical differential between the printed circuit board 806 and the ground film 805. In some embodiments, the standoff members 861 may be formed directly from the printed circuit board 806, for example, through additional laminations, and allow for the dome switch to be situated beneath the printed circuit board 806.

The track pad 116 further includes compound mounting points or support members 816 arranged on the ground film 805. As illustrated, intervening compliance members or standoffs may be included to protect the ground film 805.

Figure 9:
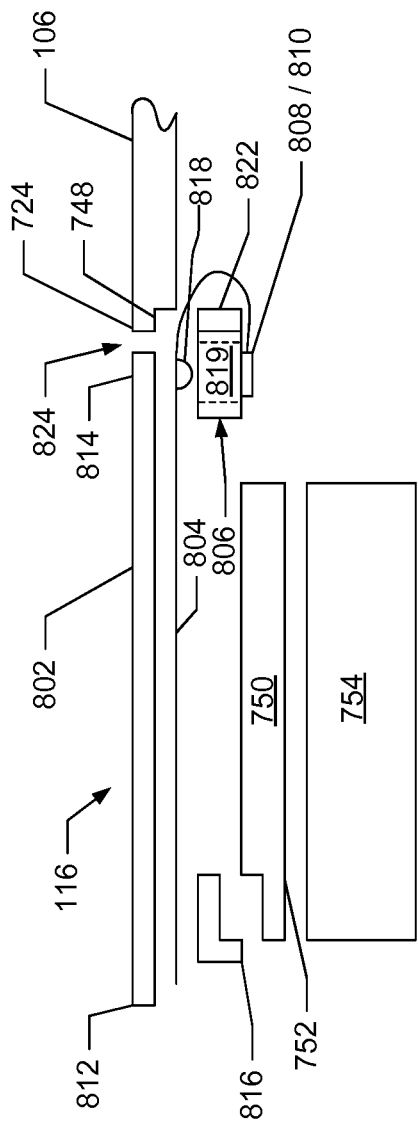
FIG. 9 illustrates an exploded side view of the track pad of FIG. 7.

As further illustrated in FIG. 9, in some embodiments a backing plate 750 may be positioned below the track pad 116. The backing plate 750 may be configured to define a planar surface 752 which may form a portion of a compartment in which a mass storage device 754 (e.g., a hard drive or solid state memory) is positioned. In this regard, the planar surface 752 of the backing plate 750 may abut an elastomeric material coupled to the mass storage device 754. Further, the printed circuit board 806 may comprise one or more protrusions 822 that extend past the second end 814 of the cover 802. As illustrated, the protrusions 822 may be configured to engage recesses 748 defined in the outer case 106 proximate the opening 724 therein. Accordingly, the protrusions 822 may prevent the track pad 116 from extending out of the opening 724 in the top case 106. As further illustrated, the touch sensor 804 may extend past the second end 814 of the cover 802 and past the protrusions 822 such that a gap 824 between the cover and the top case 106 may be concealed. In this regard, the touch sensor 804 may define a relatively dark color, such as black, which conceals the gap 824 and other components in the personal computing device 100.

Figure 10:
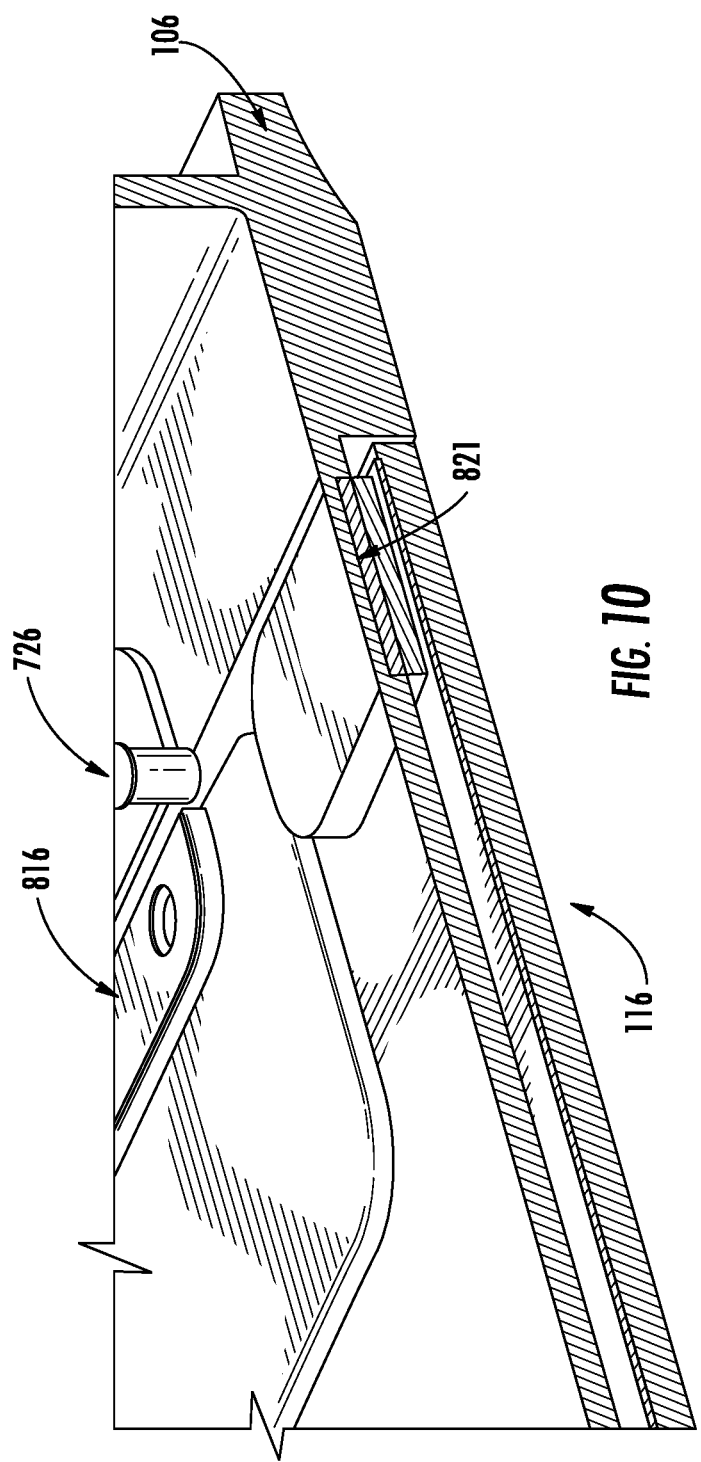
FIG. 10 illustrates an expanded view of acoustic foam of the track pad of FIG. 7.

Turning now to FIG. 10, an expanded view of the acoustic transmission members 821 is provided. As shown, the acoustic transmission members 821 are coupled between the track pad 116 and the top case 106 such that audible noise produced at the dome switch 818 is transmitted away from a user of the device 100/300 and into an interior cavity thereof. Therein the cavity, the acoustic noise may be dissipated through interaction with a plurality of interior components. It should be understood that the acoustic transmission members 821 may also function to dampen the audible noise, and may provide other functions not explicitly described herein.

As described above, the track pad 116 may be pivotally coupled to top case 106 through members 816. Furthermore, dome switch 818 may provide a compliance feature allowing for clicking and/or pivoting of the entire assembly. As illustrated in FIG. 11, a set screw or support member 1100 may be arranged through the hole 819 of the printed circuit board 806 thereby allowing inflection of the dome switch assembly 818. The set screw 1100 may be set within support plate 728 on top cover 106 during assembly of the device 100/300.

Figure 12:
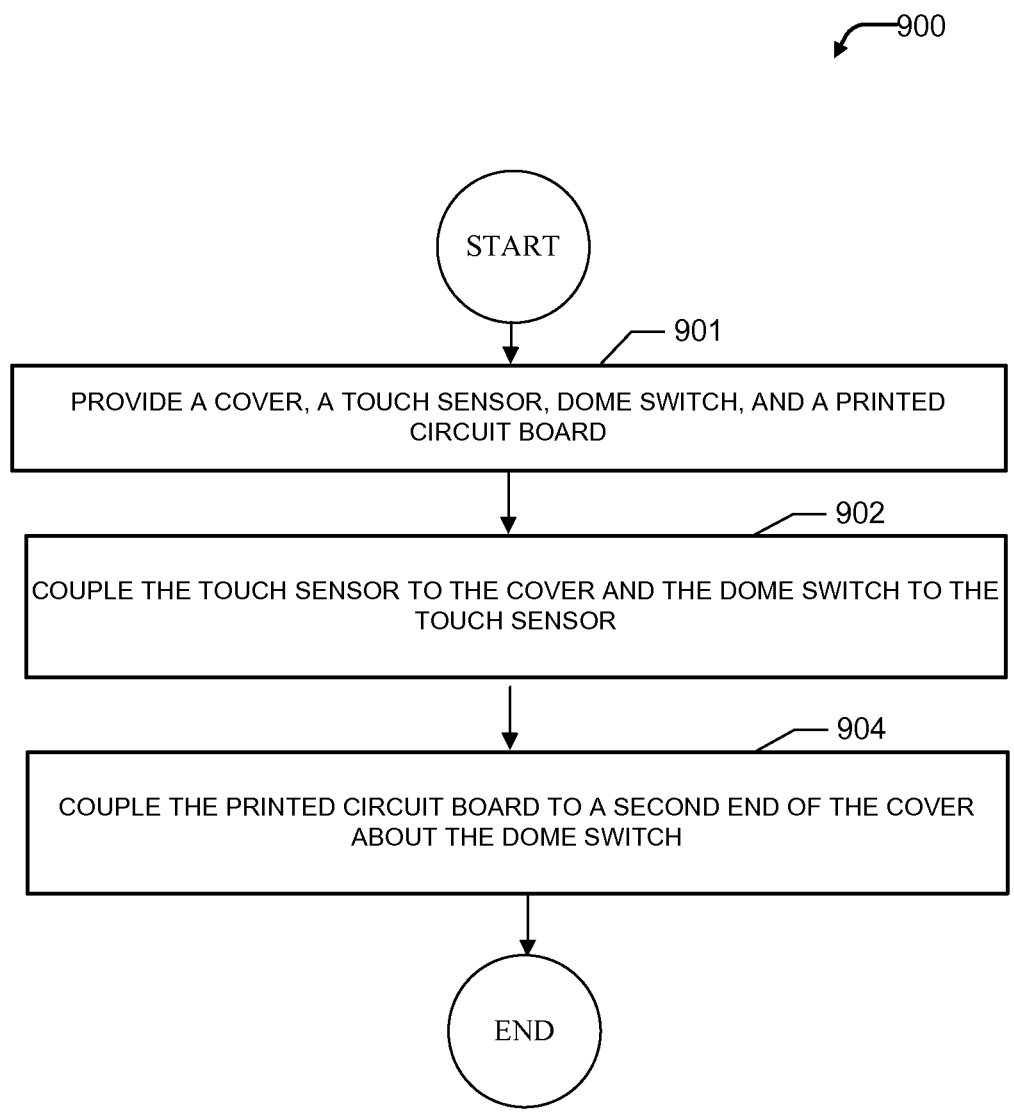
FIG. 12 illustrates a method for assembling a track pad according to an example embodiment of the present disclosure.

A related method for assembling a track pad 116 and/or device 100/300 is also provided. As illustrated in FIG. 12, the method 900 may include providing a cover extending from a first end to a second end, providing a touch sensor, providing a dome switch, and providing a printed circuit board with an opening or hole at operation 901. The method may further comprise coupling the touch sensor to the cover and coupling the dome switch to the touch sensor at operation 902. Further, the method may include coupling the printed circuit board to the second end of the cover to support the second end of the cover and coupling the printed circuit board to the touch sensor at operation 904.

In some embodiments the method may also include pivotally coupling the first end of the cover to a case of a portable computing device with the second end decoupled from the case. The method may also include concealing a gap between the cover and the case by extending the touch sensor past one or more protrusions defined by the printed circuit board at the first end of the cover.

Figure 13:
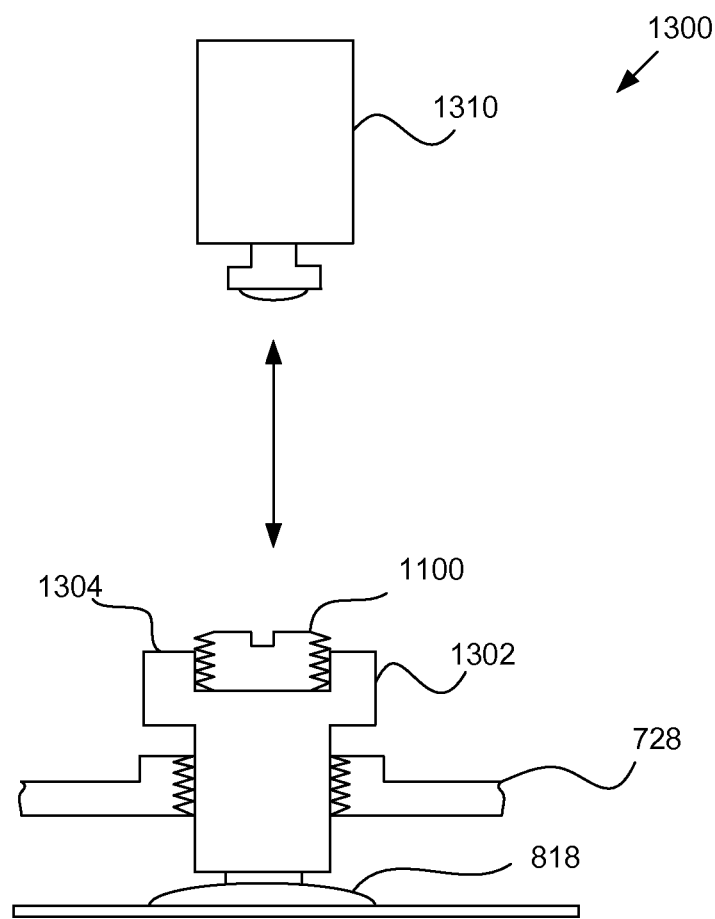
FIG. 13 illustrates a cross sectional view of dome switch and support plate arranged in a fixture to calibrate a set screw position.

Turning now to FIG. 13, a cross sectional view of dome switch 818 and support plate 728 arranged in a fixture to calibrate set screw 1100 position. In one embodiment, the position of set screw 1100 can provide good functionality for the actuation of the dome switch 818, and control audible acoustic properties related to the actuation of dome switch 818. For example, if set screw is too far into support plate 728, partial actuation of the dome switch 818 can occur. Conversely, if set screw 1100 is too far from dome switch, undesired acoustic noises may be produced, or set screw 1100 may be actuated incorrectly.

To help ensure precise positioning of set screw 1100, a gauge fixture 1302 acting as a gauge block can be inserted into support plate 728 as shown. Dimensions of gauge fixture 1302 can be well controlled and can be precisely measured prior to use. On an upper portion of gauge fixture 1302, a collar 1304 can be formed to guide and position set screw 1100.

An optical measuring device 1310 can measure and determine a distance from the measuring device 1310 to set screw 1100. In another embodiment, optical measure device 1310 can determine a distance from the measuring device to a driver bit or other tool used to attach or drive set screw 1100 into support plate 728. When this measurement is made, the optical measuring device is also measuring the additional distance attributable to the gauge fixture 1302. This measurement can be used to provide a preferred distance that the set screw 1100 should be positioned with respect to support plate 728. After that distance is determined, the gauge fixture 1302 can be removed, the correct distance calculated (by subtracting the distance attributable to the gauge fixture 1302) and the set screw 1100 correctly positioned in support plate 728. In one embodiment, the optical measuring device can again measure to the top of set screw 1100 or driver bit. The collar 1304 can advantageously position and hold set screw 1100 in place while measurements are being made when gauge fixture 1302 is placed in support plate 728. In one embodiment, collar 1304 can constrain any motion from set screw 1100.

Figure 14A:
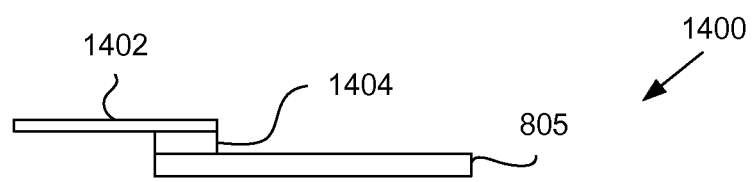
FIGS. 14A-14F illustrate steps for controllably forming a service loop in ground tabs.

Ground tabs can be attached to ground film 805 that is in turn bonded to touch sensor 804. The ground tabs can couple ground film 805 to printed circuit board 806. Ground tabs are typically bonded to the printed circuit board 806 with a high temperature bonding process. In order to avoid exposing touch sensor 804, ground file 805 and other track pad components to heat, a service loop can be provided through the ground tab. FIGS. 14A-14F illustrate steps for controllably forming a service loop in the ground tabs. FIG. 14A shows a simplified diagram 1400 of ground film 805 and ground tabs

1402. Ground tabs 1402 can be attached to ground film 805 with conductive adhesives 1404 or any other technically feasible method. For example, ground tabs 1402 can be attached to ground film 805 with anisotropic conductive film adhesives.

Figure 14B:
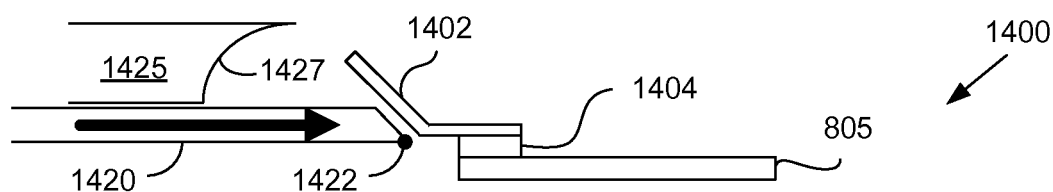

In a first step shown in FIG. 14A, the ground tabs 1402 can be arranged to form an angle with respect to ground film 805. FIG. 14B shows a bending step. Accordingly, in FIG. 14B the second end of the ground tab 1402 is bent by partially rolling the second end of the ground tab over the ground film 805. FIG. 14B also shows that bending the ground tab 1402 may include pushing a first press 1420 in the direction of the arrow (cf. FIG. 14B). The first press 1420 may have an angled point 1422 to lift the second end of the ground tab 1402 to a first position.

Figure 14C:
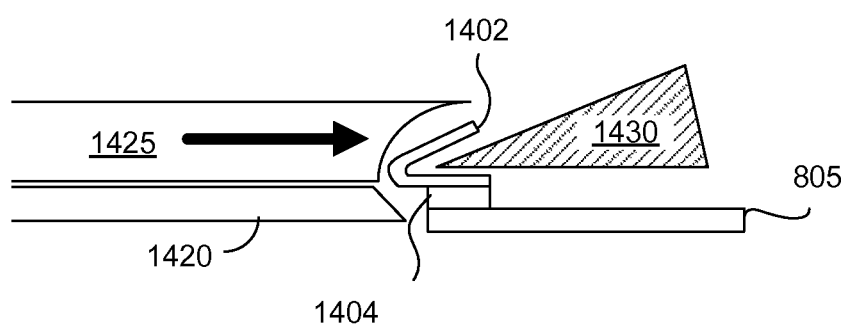

FIG. 14C shows a step of pushing a second press 1425 against the second end of the ground tab 1402 from the first position to a position forming the acute angle, in the direction shown by the arrow (cf. FIG. 14C). In some embodiments, the acute angle is 45 degrees. Accordingly, the second press 1425 having a cutout 1427 in the shape of the acute angle presses the second end of the ground tab 1402 against a fixture 1430. The fixture 1430 has an edge formed in the acute angle. In some embodiments, the steps shown in FIG. 14C, FIG. 14D, and FIG. 14E are performed with the fixture 1430 in place, as shown.

Figure 14D:
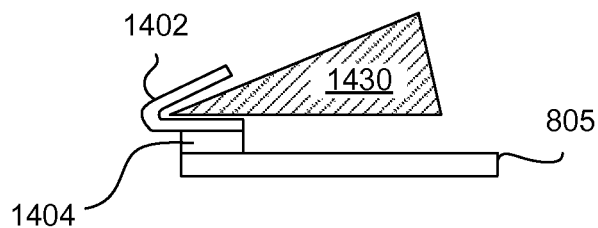
Figure 14E:
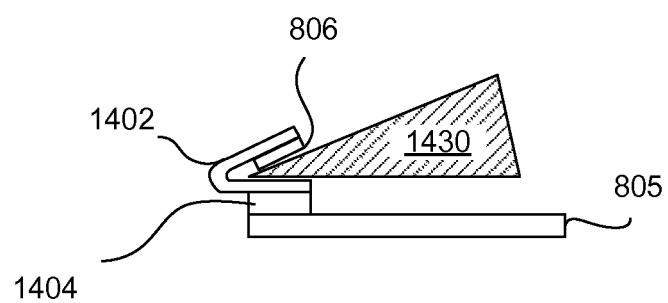

FIG. 14D shows ground tab 1402 arranged to form an acute angle with respect to ground film 805. In a second step, the printed circuit board 806 can be bonded to ground tab 1402. This step is illustrated in FIG. 14E. In some embodiments, fixture 1430 thermally isolates a contact point of the printed circuit board 806 with the ground tab 1402 from the first end of the ground tab proximal to the ground film 805. The step shown in FIG. 14E may include arranging the printed circuit board 806 to contact the ground tab 1402 by pressing the second end of the ground tab to the printed circuit board 806 over the fixture 1430. Since printed circuit board 806 is disposed away from ground film 805, any heat used during the bonding process is also away from ground film 805. This can protect elements near and around ground film 805 from exposure to extremes in heat. In particular, in some embodiments steps 14D and 14E prevent the formation of air or gas bubbles in adhesive portions included in and proximal to ground film 805. The appearance of air bubbles is undesirable, since air bubbles tend to change in size over time, thereby altering the calibration settings of a touch sensor proximal to ground film 805.

Figure 14F:
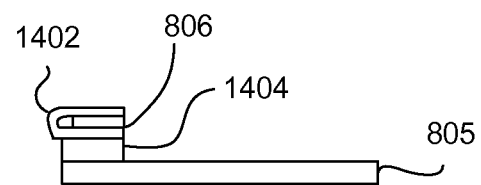
Figure 15:
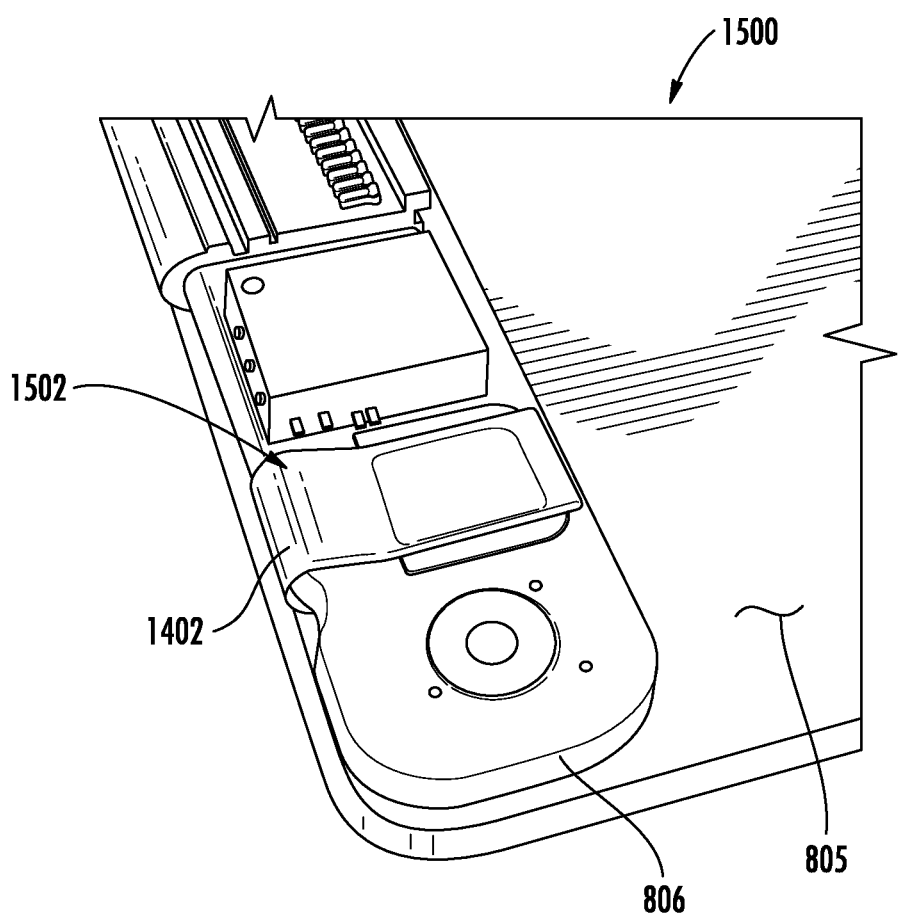
FIG. 15 is an isometric view of printed circuit board positioned over ground film with ground tabs.

After the bond between ground tab 1402 and printed circuit board 806 has set, the printed circuit board 806 can be positioned against adhesive 1404 and ground film 805. This is shown in FIG. 14F. In one embodiment, the printed circuit board 806 is positioned against adhesive 1404 and ground film 805 only after the temperature of the printed circuit board 806, and more particularly the interface between printed circuit board 806 and ground tabs 1402 have cooled at a temperature that will not cause damage to ground film 805, adhesive 1404 or the surrounding area. This method can enable shorter ground tabs 1402 by virtue of positioning the printed circuit board 806 at an acute angle. The shorter ground tabs 1402 can be easier to dress within the portable computing device. 100. FIG. 15 is an isometric view of printed circuit board 806 positioned over ground film 805 with ground tabs 1402. The ground tabs 1402 can be coupled to printed circuit board 806 in such a manner that can allow relatively small loops 1502 to be formed.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. A track pad, comprising:
   a cover having a first end and a second end opposite the first end, the first end of the cover configured to be pivotally coupled to a case of a portable computing device;
   a printed circuit board (PCB) coupled with an interior facing surface of the cover and proximate the second end of the cover;
   a touch sensor in communication with the PCB and disposed between the PCB and the cover; and
   a switch directly coupled to the touch sensor and extending into an opening defined by the PCB, wherein the switch is configured to be actuated by a support member of the portable computing device that extends into the opening in the PCB when the cover pivots about the first end.

2. The track pad of claim 1, wherein the PCB defines a protrusion that extends past the second end of the cover and is configured to engage the case.

3. The track pad of claim 2, wherein the touch sensor extends past the protrusion and is configured to conceal a gap between the cover and the case.

4. The track pad of claim 1, wherein a vertical position of the support member is adjustable so that a distance the cover pivots before the switch is actuated by the support member changes with adjustment of the vertical position of the support member.

5. The track pad of claim 1, further comprising at least one acoustic transmission member configured to guide acoustic energy within the track pad, wherein the acoustic energy is imparted to the cover by actuating and de-actuating the switch.

6. A method for assembling a track pad in a portable computing device, the method comprising:
   pivotally coupling a first end of a cover to a case of the portable computing device;
   coupling a printed circuit board (PCB) with an interior facing surface of a second end of the cover, the second end opposite the first end
   positioning a touch sensor between the PCB and the cover;
   mechanically coupling a switch to the touch sensor proximate an opening defined by the PCB; and
   positioning a support member proximate the opening so that when the cover pivots the support member activates the switch through the opening in the PCB.

7. The method of claim 6, further comprising: forming a protrusion on the PCB that extends past the second end of the cover and is configured to engage the top case.

8. The method of claim 7, further comprising: extending the touch sensor past the protrusion; and
   concealing a gap between the cover and the case.

9. The method of claim 6, further comprising: adjusting a vertical engagement position of the support member so that a distance the second end of the cover travels before actuating the switch changes.

10. The method of claim 9 wherein adjusting a vertical engagement position comprises:
    fitting a gauge fixture having controlled dimensions within a threaded hole in the support member; and constraining the support member with a collar included in the gauge fixture configured to constrain a set screw.

11. The method of claim 10, further comprising contacting a portion of the switch with the gauge fixture through the threaded hole.

12. The method of claim 11 further comprising measuring a distance between the switch and the support member with an optical measuring device and the gauge fixture having controlled dimensions.

13. A track pad, comprising:
a cover having a first end and a second end opposite the first end, the first end of the cover configured to pivotally couple to a case of a portable computing device;
a printed circuit board (PCB) mechanically coupled to an interior facing surface of the second end of the cover;
a touch sensor disposed between the PCB and the cover;
a switch mechanically coupled to the touch sensor and configured to actuate upon pivoting the cover about the first end; and
at least one acoustic transmission member coupled to the cover in a position proximate to the first end of the cover and configured to guide acoustic energy within the track pad, wherein the acoustic energy is imparted to the cover by actuating and de-actuating the switch.

14. The track pad of claim 13 further comprising: a support member that actuates the switch through an opening in the PCB when the cover pivots about the first end.

15. The track pad of claim 14, wherein a vertical position of the support member is adjustable so that a distance the cover pivots before the switch is actuated by the support member changes with adjustment of the vertical position of the support member.

16. The track pad of claim 15, wherein the at least one acoustic transmission member is further coupled to the case of the portable computing device.

17. The track pad of claim 13, wherein the at least one acoustic transmission member is configured to guide at least a portion of the acoustic energy from the cover to the case.

18. The track pad of claim 13, wherein the at least one acoustic transmission member is further configured to dampen at least a portion of the acoustic energy.

19. A portable computing device, comprising:
a lid portion configured to include a display;
a base portion including a top case and bottom case, pivotally coupled to the lid portion, the top case comprising:
a track pad zone configured to support a track pad, wherein the track pad comprises a cover having a first end and a second end opposite the first end, the first end of the cover configured to be pivotally coupled to the top case, a printed circuit board (PCB) coupled to an interior facing surface of the cover, a touch sensor in communication with the PCB and coupled to the second end of the cover, wherein the touch sensor is in communication with the PCB and disposed between the PCB and the cover, and at least one acoustic transmission member is coupled to the cover proximate the first end of the cover and configured to guide acoustic energy within the track pad.

20. The portable computing device of claim 19, wherein the at least one acoustic transmission member is configured with a first side coupled to the cover proximate to the first end of the cover and a second side in contact with the top case.

21. The portable computing device of claim 19 further comprising:
a switch directly coupled to the touch sensor and extending into an opening defined by the PCB, wherein the switch is configured to be actuated by a support member of the portable computing device that extends into the opening in the PCB when the cover pivots about the first end.

22. The portable computing device of claim 21, wherein the support member comprises a vertically adjustable set screw configured to set a distance the cover travels when the cover pivots about the first end when the switch is actuated by the support member.

23. The portable computing device of claim 19, wherein the at least one acoustic transmission member is further coupled to the top case of the portable computing device.

24. The portable computing device of claim 19, wherein the at least one acoustic transmission member is configured to guide an acoustic energy from the cover to the top case.

25. The portable computing device of claim 21, wherein the at least one acoustic transmission member is further configured to dampen at least a portion of an acoustic energy generated upon actuation of the switch.

26. A method for assembling a track pad, the method comprising:
providing a cover having a first end and a second end opposite the first end, the first end of the cover configured to be pivotally coupled to a case of a portable computing device;
coupling a printed circuit board (PCB) to an interior facing surface of the cover and proximate the second end of the cover;
coupling a touch sensor between the PCB and the cover; and,
mechanically and electrically coupling a switch to an interior facing surface of the touch sensor, wherein the switch is configured to be actuated by a support member of the portable computing device that extends into an opening in the PCB overlapping the switch when the cover pivots about the first end.

27. The method of claim 26 wherein the support member comprises an adjusting screw, wherein the adjusting screw is configured to locate a position at which the switch is activated when the cover pivots about the first end.

28. The method of claim 27 wherein coupling the switch to the touch sensor comprises placing a support member through the opening to allow an inflection of the switch upon actuating the support member.

29. The method of claim 26 wherein providing a cover comprises:
pivotally coupling the first end of the cover to a case of the portable computing device; and
decoupling the second end of the cover from the case of the portable computing device.

* * * * *

UNITED STATES PATENT AND TRADEMARK OFFICE
CERTIFICATE OF CORRECTION

| | | |
|---|---|---|
| PATENT NO. | : 9,030,839 B2 | Page 1 of 1 |
| APPLICATION NO. | : 13/855688 | |
| DATED | : May 12, 2015 | |
| INVENTOR(S) | : William F. Leggett et al. | |

It is certified that error appears in the above-identified patent and that said Letters Patent is hereby corrected as shown below:

On the Title Page, Item number (60) Related U.S. Application Data: provisional application No. "60/715,820" should read -- provisional application No. 61/715,820 --.

Signed and Sealed this
Eleventh Day of August, 2015

Michelle K. Lee
*Director of the United States Patent and Trademark Office*